(12) United States Patent
Goan et al.

(10) Patent No.: US 8,197,720 B2
(45) Date of Patent: Jun. 12, 2012

(54) CORE/SHELL TYPE SEMICONDUCTOR NANOPARTICLE AND METHOD FOR PRODUCTION THEREOF

(75) Inventors: Kazuyoshi Goan, Kanagawa (JP); Kazuya Tsukada, Kanagawa (JP); Naoko Furusawa, Tokyo (JP)

(73) Assignee: Konica Minolta Medical & Graphic, Inc., Tokyo (JP)

( * ) Notice: Subject to any disclaimer, the term of this patent is extended or adjusted under 35 U.S.C. 154(b) by 426 days.

(21) Appl. No.: 12/523,154

(22) PCT Filed: Jan. 18, 2008

(86) PCT No.: PCT/JP2008/050591
§ 371 (c)(1),
(2), (4) Date: Jul. 14, 2009

(87) PCT Pub. No.: WO2008/090814
PCT Pub. Date: Jul. 31, 2008

(65) Prior Publication Data
US 2010/0096599 A1    Apr. 22, 2010

(30) Foreign Application Priority Data
Jan. 22, 2007  (JP) ................................ 2007-011187

(51) Int. Cl.
*H01B 1/06* (2006.01)
*H01B 1/02* (2006.01)
*C09K 11/02* (2006.01)
*H01L 29/06* (2006.01)
*H01L 33/00* (2010.01)
*B32B 5/16* (2006.01)

(52) U.S. Cl. ........... 252/518.1; 252/301.4 R; 252/519.5; 252/521.3; 257/14; 257/103; 428/403

(58) Field of Classification Search .......... 313/499–501; 428/403; 257/14, 103; 252/301.4 R, 518.1, 252/519.5, 521.3
See application file for complete search history.

(56) References Cited

U.S. PATENT DOCUMENTS

| 7,431,867 | B2 * | 10/2008 | Okada et al. ................. 252/500 |
| 2005/0129947 | A1 * | 6/2005 | Peng et al. ................... 428/403 |
| 2010/0163798 | A1 * | 7/2010 | Ryowa et al. ......... 252/301.4 R |

FOREIGN PATENT DOCUMENTS

| JP | 5224261 | 9/1993 |
| JP | 2000265166 | 9/2000 |
| JP | 2003064278 | 3/2003 |
| JP | 2004332028 | 11/2004 |
| JP | 2005120117 | 5/2005 |
| JP | 2006186317 | 7/2006 |
| JP | 2007077010 | 3/2007 |
| JP | 2007145089 | 12/2007 |

OTHER PUBLICATIONS

Jun et al., "Synthesis of multi-shell nanocrystals by a single step coating process," Nanotechnology, 17, pp. 3892-3896 (2006).*
Xie et al., Synthesis and Characterization of Highly Luminescent CdSe-Core CdS/Zn0.5Cd0.5S/ZnS Multishell Nanocrystals, J. Am. Chem. Soc., 127, pp. 7480-7488 (2005).*
Chemical Abstracts, 146-16557, Jun, Shinae et al., Synthetic of multi-shell nanocarystals by a single step coating process., Manotechnology, 2006, vol. 17, No. 15, p. 3892-3896.

* cited by examiner

*Primary Examiner* — Mark Kopec
*Assistant Examiner* — Jaison Thomas
(74) *Attorney, Agent, or Firm* — Lucas & Mercanti, LLP

(57) ABSTRACT

Disclosed are core/shell type semiconductor nanoparticles exhibiting a sufficient emission intensity without causing a blink phenomenon (blinking). The core/shell-type semiconductor nanoparticles have an average particle size of from 2 to 50 nm and comprise an intermediate layer between a core portion and a shell portion, wherein band gap widths of bulk crystals which have the same compositions as those of the core portion, the intermediate portion and the shell portion, respectively, are in the order of:

core portion<shell portion<intermediate layer.

7 Claims, No Drawings

CORE/SHELL TYPE SEMICONDUCTOR NANOPARTICLE AND METHOD FOR PRODUCTION THEREOF

CROSS REFERENCE TO RELATED APPLICATION

This is a U.S. National Phase Application under 35 U.S.C. 371 of International Application PCT/JP2008/050591, filed on Jan. 18, 2008, which claims the priority of Japanese Application No. 2007-011187 filed Jan. 22, 2007, the entire contents of both Applications are hereby incorporated by reference.

TECHNICAL FIELD

The present invention relates to core/shell type semiconductor nanoparticles exhibiting sufficient emission intensity and no blink phenomenon (blinking) and a production method thereof.

TECHNICAL BACKGROUND

It is well-known that, of ultra-fine particles of semiconductors or metals, nanosized particles having a smaller particle diameter than an electron wavelength (approximately 10 nm) have a profound effect of finiteness of size on electron motion, as a quantum size effect and exhibit specific physical properties differing from a bulk body (Non-patent document 1).

Core/shell-structured semiconductor nanoparticles, which are covered with a material differing from the particulate core portion, can be functionalized without altering the size or form of core particles or are expected to exhibit a characteristic differing from any of bulk materials of the core and shell so that such nanoparticles have been noted as a novel high-active catalyst, a photofunctional material or an optical element material. For instance, when the surfaces of light-emissive nanoparticles are exposed, a large number of defects existing on the nanoparticle surface becomes an emission killer, leading to reduced emission efficiency. As a result, an emission intensity can be enhanced by a coverage of a shelling material having a band gap greater than that of nanoparticles, corresponding to the emission wavelength thereof (as described in, for example, Patent documents 1-4).

Patent document 1 discloses ultra-fine particles having an insulating layer mainly composed of silicon oxide on the surface of a silicon nucleus. Patent document 2 discloses phosphor particles coated with a glass component. Patent document 3 discloses core/shell-structured particles comprised of a phosphor core of a 10 nm or less diameter and containing a first additive element to form an acceptor level and a second additive component to form a donor level in a semiconductor containing ZnS as a primary main component and partially containing or not containing a II-VI Group compound semiconductor as a secondary component, and a shell having a band gap greater than that corresponding to an emission wavelength of the phosphor. Patent document 4 discloses 2-50 nm core/shell particles comprised of a nanosized crystalline semiconductor core and an electrically conductive shell with attached surface-modifying molecules on the particle surface.

However, a sufficiently high luminescence intensity has not been attained as yet and a blink phenomenon, so-called blinking was observed in emission of nanoparticles, for example, in single-molecule fluorescence, becoming a problem in practice.

Patent document 1: Japanese Patent Application Publication JP 5-224261A,
Patent document 2: JP 2000-265166,
Patent document 3: JP 2005-120117
Patent document 4: JP 2003-64278
Non-patent document: "Nikkei Sentangijutsu" No. 2003-1-27 pages 1-4

DISCLOSURE OF THE INVENTION

Problem to be Solved in the Invention

The present invention has come into being in view of the foregoing problems and it is an object of the present invention to provide core/shell type semiconductor nanoparticles exhibiting a sufficient emission intensity without causing a blink phenomenon (blinking).

Means to Solve the Problem

It was well-known that nano-sizing a core particle resulted in a quantum size effect and forming the above-described core/shell structure led to an increase in band gap energy, thereby rendering it feasible to achieve targeted characteristics; however, there has not been enough study of core/shell type semiconductor nanoparticles having an intermediate layer between the core and shell. In view of the foregoing, the present invention has been achieved through study in this area. Thus, the problems related to the present invention was overcome by the following constitution.

1. Core/shell-type semiconductor nanoparticle having an average particle size of from 2 to 50 nm and comprising an intermediate layer between a core portion and a shell portion, wherein band gap widths of bulk crystals, which have the same compositions as those of the core portion, the intermediate portion and the shell portion, respectively, are in the order of:

core portion<shell portion<intermediate layer.

2. The core/shell type semiconductor nanoparticle as described in the foregoing 1, wherein the core portion contains Si as a main component and the intermediate layer contains an oxide of Si as a main component.

3. A method for producing core/shell type semiconductor nanoparticles having an average particle size of from 2 to 50 nm and comprising an intermediate layer between a core portion and a shell portion, wherein band gap widths of bulk crystals, which have the same compositions as those of the core portion, the intermediate portion and the shell portion, respectively, are in the order of:

core portion<shell portion<intermediate layer.

Effect of the Invention

The foregoing means of the present invention make it possible to provide core/shell type semiconductor nanoparticles exhibiting sufficient emission intensity without exhibiting any blinking phenomenon (blinking).

PREFERRED EMBODIMENTS OF THE INVENTION

The core/shell type semiconductor nanoparticles of the present invention is featured in that the core/shell type semiconductor nanoparticles have an average particle size of from 2 to 50 nm and comprise an intermediate layer between the core portion and the shell portion, and band gap widths of bulk crystals respectively having the same compositions as those of the core portion, the intermediate portion and the shell portion are in the sequence set forth as below:

core portion<shell portion<intermediate layer.

One of the preferred embodiments is that the core portion contains Si as the main component, while the intermediate layer contains an oxide of Si as the main component.

In the following, there will be detailed the present invention and constituent features.

Forming Material of Semiconductor Nanoparticle

Semiconductor nanoparticles related to the invention can be formed by use of a variety of semiconductor materials.

Preferred examples of a II-VI group semiconductor include MgS, MgSe, MgTe, CaS, CaSe, CaTe, SrS, SrSe, SrTe, BaS, BaSe, BaTe, ZnS, ZnSe, ZnTe, CdS, CdSe, HgS, HgSe and HgTe.

Preferred examples of a III-V group semiconductor include GaAs, GaN, GaP, GaSb, InGaAs, InP, InN, InSb, InAs, AlAs, AlP, AlSb and AlS.

Of IV group semiconductors, Ge, Pb and Si are suitable.

In the present invention, preferably, phosphor semiconductor particles have a core/shell structure. In such a case, it is preferred that semiconductor nanoparticles are those which have a core/shell structure constituted of a core particle of a semiconductor particle and a shell layer covering the core particle, and that the core particle differs in chemical composition from the shell layer.

In the following, there will be described the core particle and the shell layer.

Core Particle

Semiconductor materials used for core particles may employ a various kinds of semiconductor materials. Specific examples thereof include MgS, MgSe, MgTe, CaS, CaSe, CaTe, SrS, SrSe, SrTe, BaS, BaSe, BatE, ZnS, ZnSe, ZnTe, CdS, CdSe, CdTe, GaS, GaSe, GaTe, GaAs, GaP, GaSb, InGaAs, InP, InN, InSb, InAs, AlAs, AlP, AlSb, AlS, PbS, PbSe, Ge, Si and a mixture of these. In the present invention, a specifically preferred semiconductor material is Si.

Further, dope materials such as Ga may optionally be contained in a slight amount.

The average particle size of core particles related to the present invention is preferably from 1 to 10 nm. The average particle size of core particles related to the invention refers to a cumulative 50 vol. % diameter which can be determined through a laser scattering method.

Shell Layer

Semiconductor materials used for a shell may employ various kinds of semiconductor materials. Specific examples thereof include $SiO_2$, ZnO, ZnS, ZnSe, ZnTe, CdO, CdSe, CsTe, MgS, MgSe, GaS, GaN, GaP, GaAs, GaSb, InAs, InN, InP, InSbAlAs, AlN, AlP, AlSb and further mixtures of these. In the present invention, a specifically preferred semiconductor material is $SiO_2$ or ZnS.

The average shell layer thickness related to the invention is preferably from 0.1 to 3 nm.

The shell layer related to the invention may not completely cover all of the surface of a core particle unless partial exposure of the core particle has an adverse effect.

Intermediate Layer

In one embodiment of the present invention, the semiconductor nanoparticles have an intermediate layer between a core portion and a shell portion. A specific example is the composition which is analogous to the core and shell portions but differs from the core and shell portions. The preferred composition of an intermediate layer is $SiO_2$.

In the present invention, the thickness of the intermediate layer is preferably from 0.1 to 2 nm.

One novel feature of the present invention is that band gap widths of bulk crystals which have the same compositions as those of the core portion, the intermediate portion and the shell portion, respectively, are in the sequence of core portion<shell portion<intermediate layer. The said band gap width may be controlled by varying the composition of the foregoing semiconductor material. The preferred combination is a core portion of Si, an intermediate layer of $SiO_2$, and a shell portion of ZnS.

As described above (also as set forth in Patent documents 1-4), it has been known that nanoparticles exhibiting enhanced emission intensity are achieved by a coverage of a shelling material having a greater band gap. This is understood to be due to enhancement of quantum confinement effect and passivation of surface defects. In practice, however, the core portion is not completely covered, which is the reason for the fact that a sufficiently high emission intensity is not achieved or blinking is observed. The intermediate layer of the present invention effectively complements the function of an incomplete shell. The band gap width of an intermediate layer composition which is greater than that of a core portion, effectively promotes a quantum confinement effect and passivation of surface defects. When the band gap width of the intermediate layer is less than that of the shell portion, no effectiveness by the intermediate layer can be achieved.

In the present invention, the band gap width was determined in accordance with a method to determine an optical band gap from an electronic spectrum (a so-called Tauc Plot) which has been generally employed for amorphous semiconductors.

Namely, in photoabsorption due to an interband optical transition of an amorphous semiconductor, the relationship between absorbance and photon energy is represented by the following formula:

$$\alpha = k(E-E_0)^2/E (k:\text{constant})$$

wherein $\alpha$ is absorbance, E is photon energy and $E_0$ is the optical band gap. Using this formula, a photon energy is plotted on the ordinate and the square root of the product of absorbance and photon energy is plotted on the abscissa and a tangent line is drawn and the intersection of the tangent line and the abscissa is the optical band gap (T. Shimizu "Amorphous Semiconductor" published by Baifukan, 1994, p 201).

The expression, bulk crystal refers to an assembly of crystalline particles having a particle size of 1 μm or more, and the expression, bulk composition refers to the composition of the bulk crystal.

Production Method of Core/Shell Semiconductor Nanoparticle

The core/shell type semiconductor nanoparticles are those having an average particle size of from 2 to 50 nm, which comprise an intermediate layer between the core portion and the shell portion. Production of the core/shell type semiconductor nanoparticles may employ various methods known in the art.

Production methods by a liquid phase process include, for example, a coprecipitation method, a sol-gel method, a homogeneous precipitation method and a reduction method. There are further included methods superior in production of nanoparticles, such as a reverse micelle method and a supercritical hydrothermal synthesis method (as described in, for example, JP 2002-322468A, JP 2005-239775A, JP 10-310770A, and JP 2000-104058A).

Production methods by a gas phase process include (1) a method in which a raw material semiconductor is evaporated by a first high-temperature plasma generated between opposed electrodes and allowed to pass through a second high temperature plasma generated through electrodeless discharge in a reduced pressure environment as described in, for example, JP 6-279015A), and a laser ablation method (described in, for example, JP 2004-356163A). There is also preferably employed a method in which raw material gas is subjected to a gas phase reaction in a low pressure state to synthesize a powder containing particles.

The production method of core/shell type semiconductor nanoparticles of the present invention is preferably a production method by a liquid phase process.

EXAMPLES

The present invention will be further described in detail with reference to examples but the present invention is by no means limited to these.

Preparation of Si and Si/SiO$_2$ Nanoparticle

Into 50 ml of dioctyl ether were added 1 ml of oleic acid and 1 ml of oleylamine with stirring and then heated to 100° C. while degassing. After stirred for 3 hrs., the reaction mixture was heated to 200° C. with filling argon gas within a reaction vessel. After being stirred for 1 hr., SiCl$_4$ was dropwise added and stirred for 30 min. After being cooled to 100° C. and further stirred for 5 hrs., the solution was cooled to room temperature. The solution contained silicon nanoparticles having an average particle size of 3 nm.

The obtained solution was dried in vacuo to obtain a mixture of a gel-form organic material and nanoparticles. The obtained mixture was washed with methanol several times to obtain a dark brown powder. The thus obtained powder was subjected a surface treatment according to the procedure described below.

Annealing was conducted by heating in an electric furnace and a plasma treatment was conducted in such a manner that a sample was exposed to a plasma generated by applying an electrical current to an induction coil using an RF power source in a vacuum chamber filled with a desired gas.

Sample 1: subjected to argon plasma treatment for 60 min

Sample 2: subjected to argon plasma treatment for 60 min and then subjected to an annealing treatment at an atmospheric 700° C. for 2 hrs.

It was proved that the thus obtained powdery materials were each nanoparticles having an average particle size of 2 nm through transmission electron microscope (TEM) observation; Sample 1 was Si particles, while Sample 2 was particles comprised of a silicon nucleus and a silicon oxide surface layer. It was further proved through TEM observation that the surface layer thickness of Sample 2 was 0.2 nm on the average.

Coverage of ZnS Shell Layer

Samples 1 and 2 were each added into trioctylphosphine oxide (TOPO) and, after being dispersed ultrasonically, was heated to 300° C. The obtained dispersion liquid was equally divided in ½ and to one half of them was added a solution having reacted trimethylsilylsulfide and dimethyl zinc in trioctylphosphine (TOP). After stirring for 1 hr., the temperature was lowered to room temperature. In both samples, the shell layer thickness was an average of 0.2 nm, determined by TEM observation.

With respect to materials constituting a core, an intermediate layer and a shell, the respective band gaps which were determined in accordance with a method to determine the optical band gap from an electron spectrum (a so-called Tauc Plot) were Si=1.12 eV, SiO$_2$=9.0 eV and ZnS=3.7 eV. Further, with respect to CdSe used in dispersion liquid 5 described below, the band gap was 1.74 eV.

In addition to the foregoing dispersion liquids 1-4, there was also prepared a semiconductor nanoparticle dispersion liquid, as described below.

Dispersion Liquid 5

The foregoing Sample 1 was added into trioctylphosphine oxide (TOPO), dispersed ultrasonically and then heated to 200° C. To the obtained dispersion liquid were added a TOPO solution of cadmium acetate and a TOP solution of selenium to form a 0.2 nm thick CdSe intermediate layer on the surface of Si particles. Further, after heating to 300° C. was added thereto a solution obtained by reacting trimethylsilylsulfide and dimethylzinc in TOP. After being stirred for 1 hr., the temperature was lowered to room temperature, whereby a ZnS shell layer was formed. The thickness of the surface shell layer was proved to be 0.2 nm on average through TEM observation.

Dispersion Liquid 6

Sample 1 was added into trioctylphosphine oxide (TOPO), dispersed ultrasonically and then heated to 300° C. To the obtained dispersion liquid was added a solution obtained by reacting trimethylsilylsulfide and dimethylzinc in TOP to form a 0.2 nm thick ZnS intermediate layer. After stirring for 1 hr., a TOPO solution of cadmium acetate and a TOP solution of selenium were added thereto to form a 0.2 nm thick CdSe shell layer on the Si particle surface.

Fluorescence Quantum Yield

Thus obtained nanoparticle dispersion liquids 1-6 (see also Table 1) were each exposed to an exciting light at a wavelength of 350 nm and emitted fluorescence spectrum was measured. A relative quantum efficiency was determined from a molar absorption coefficient obtained from an absorption spectrum of a sample, a wavenumber integral value of a fluorescence spectrum and a refractive index of a solvent, which are represented by a relative value, on the basis of dispersion liquid 1.

A quantum yield ($\phi_x$) of the respective samples can be determined by the following formula:

$$\phi_x = F_x n_x^2 / F_r n_r^2 \cdot \epsilon_r c_r d_r / \epsilon_x c_x d_x \cdot \phi_r \tag{A}$$

where $\phi_r$ is a quantum yield of a standard reference material, $F_x$ is a wavenumber integral value of a sample, $n_x$ is a refractive index of a sample, $\epsilon_x c_x d_x$ is an absorbance of a sample, $F_r$ is a wavenumber integral value of a standard reference material, $n_r$ a refractive index of a standard reference material, and $\epsilon_r c_r d_r$ is an absorbance of a standard reference material.

The relative quantum yield of a sample is represented by a relative value, based on the relative quantum efficiency of dispersion liquid being 100%.

Fluorescence Observation of Single Particle

Using a fluorescence microscope, samples were each observed with respect to behavior of fluorescence emission and evaluated based on the following criteria:

C: marked blinking is observed and being unacceptable in practice

B: blinking is observed in some ten seconds but acceptable in practice

A: blinking is rarely observed and being no problem in practice

The content of a sample and the results of the foregoing evaluation are shown in Table 1.

TABLE 1

| Dispersion Liquid No. | Nanoparticle Composition | | | Fluorescence Quantum Yield (%) | Blinking | Remark |
| --- | --- | --- | --- | --- | --- | --- |
| | Core | Intermediate Layer | Shell | | | |
| 1 | Si | — | — | 100 | C | Comp. |
| 2 | Si | — | SiO$_2$ | 110 | C | Comp. |
| 3 | Si | — | ZnS | 115 | C | Comp. |
| 4 | Si | SiO$_2$ | ZnS | 210 | A | Inv. |
| 5 | Si | CdSe | ZnS | 115 | C | Comp. |
| 6 | Si | ZnS | CdSe | 200 | A | Inv. |

As is apparent from the results shown in Table 1, samples related to the present invention resulted in markedly higher fluorescence quantum yield, while the undesired blinking was rarely observed.

What is claimed is:

1. Core/shell-type semiconductor nanoparticles having an average particle size of from 2 to 50 nm and comprising an intermediate layer between a core portion and a shell portion, wherein band gap widths of bulk crystals which have the same compositions as those of the core portion, the intermediate portion and the shell portion, respectively, are in the order of: core portion<shell portion<intermediate layer.

2. The core/shell type semiconductor nanoparticles of claim 1, wherein the core portion contains Si as a main component and the intermediate layer contains an oxide of Si as a main component.

3. The core/shell type semiconductor nanoparticles of claim 1, wherein the core portion is a particulate core having an average particle size of from 1 to 10 nm.

4. The core/shell type semiconductor nanoparticles of claim 1, wherein the shell portion is comprised of SiO$_2$ or ZnS.

5. The core/shell type semiconductor nanoparticles of claim 1, wherein the shell portion is a layer having a thickness of from 0.1 to 3 nm.

6. The core/shell type semiconductor nanoparticles of claim 1, wherein the intermediate layer has a thickness of 0.1 to 2 nm.

7. The core/shell type semiconductor nanoparticles of claim 1, wherein the core portion is comprised of Si, the intermediate layer is comprised of SiO$_2$ and the shell portion is comprised of ZnS.

* * * * *